United States Patent
Turnbull et al.

(10) Patent No.: US 9,633,772 B2
(45) Date of Patent: Apr. 25, 2017

(54) SOLDERABLE PLANAR MAGNETIC COMPONENTS

(71) Applicant: Gentex Corporation, Zeeland, MI (US)

(72) Inventors: Robert R. Turnbull, Holland, MI (US); Andrew J. LeVesque, Holland, MI (US); Kent H. Frye, Holland, MI (US)

(73) Assignee: GENTEX CORPORATION, Zeeland, MI (US)

( * ) Notice: Subject to any disclaimer, the term of this patent is extended or adjusted under 35 U.S.C. 154(b) by 28 days.

(21) Appl. No.: 14/210,871

(22) Filed: Mar. 14, 2014

(65) Prior Publication Data
US 2014/0266550 A1 Sep. 18, 2014

Related U.S. Application Data

(60) Provisional application No. 61/781,900, filed on Mar. 14, 2013.

(51) Int. Cl.
*H01F 27/24* (2006.01)
*H01F 17/06* (2006.01)
(Continued)

(52) U.S. Cl.
CPC ....... *H01F 17/0006* (2013.01); *H01F 27/263* (2013.01); *H01F 27/266* (2013.01);
(Continued)

(58) Field of Classification Search
CPC .. H01F 17/0006; H01F 17/0033; H01F 17/04; H01F 27/263; H01F 27/266;
(Continued)

(56) References Cited

U.S. PATENT DOCUMENTS 3,593,217 A 7/1971 Weber
3,691,497 A 9/1972 Bailey et al.
(Continued)

FOREIGN PATENT DOCUMENTS

JP 2260508 10/1990
JP 11340053 12/1999
(Continued)

OTHER PUBLICATIONS

Ferroxcube, Data Sheet, IIC10-14/4, Integrated inductive components, Sep. 1, 2008, 9 pages.
(Continued)

*Primary Examiner* — Mangtin Lian
(74) *Attorney, Agent, or Firm* — Price Heneveld LLP; Bradley D. Johnson (57) ABSTRACT

An inductive component having a printed circuit board ("PCB") with a first side and a second side. An aperture extends through the PCB and a conductive winding is printed onto the PCB surrounding the aperture. A core is formed by a first core member and a second core member. The first core member includes a first base member with at least one joining surface which is solderable to the first side. A first core leg extends at least partially through the aperture. The second core member includes at least a second base member and is coupled to the first core member or the second side. To manufacture the PCB, the first core member is soldered to the first side and then the PCB is inverted. The second core member is then coupled to at least one of the first core member or the second side.

18 Claims, 12 Drawing Sheets

(51) Int. Cl.
  *H01F 17/00* (2006.01)
  *H01F 27/26* (2006.01)
  *H05K 1/16* (2006.01)
  *H01F 3/14* (2006.01)
  *H01F 27/06* (2006.01)
  *H01F 27/28* (2006.01)

(52) U.S. Cl.
  CPC ............. *H05K 1/165* (2013.01); *H01F 3/14* (2013.01); *H01F 2027/065* (2013.01); *H01F 2027/2819* (2013.01); *H05K 2201/086* (2013.01); *H05K 2201/09063* (2013.01)

(58) Field of Classification Search
  CPC ........ H01F 27/24; H01F 27/2804; H01F 3/14; H01F 2027/2819; H01F 2027/065; H05K 1/65; H05K 2201/086; H05K 2201/09063
  USPC ........ 336/200, 212, 214, 215, 232, 178, 221
  See application file for complete search history.

(56) References Cited

U.S. PATENT DOCUMENTS

| | | |
|---|---|---|
| 5,300,911 A | 4/1994 | Walters |
| 5,747,870 A | 5/1998 | Pedder |
| 6,565,382 B1* | 5/2003 | Blodgett et al. ............. 439/547 |
| 6,741,478 B2 | 5/2004 | Shimizu et al. |
| 6,914,508 B2 | 7/2005 | Ferencz et al. |
| 7,225,018 B2 | 5/2007 | Iverson et al. |
| 7,277,001 B2 | 10/2007 | Mizushima et al. |
| 7,612,641 B2 | 11/2009 | Jean et al. |
| 7,791,445 B2 | 9/2010 | Manoukian et al. |
| 8,094,458 B2 | 1/2012 | Furnival |
| 8,299,882 B2 | 10/2012 | Ikriannikov |
| 8,302,287 B2 | 11/2012 | Lu et al. |
| 2005/0258926 A1* | 11/2005 | Weger ................... H01F 17/045 336/212 |
| 2007/0074386 A1 | 4/2007 | Lotfi et al. |
| 2009/0151153 A1* | 6/2009 | Liu et al. ......................... 29/605 |
| 2011/0148563 A1* | 6/2011 | Tsai ............................. 336/200 |
| 2012/0287582 A1 | 11/2012 | Vinciarelli et al. |
| 2013/0207767 A1* | 8/2013 | Worthington ....... H01F 27/2804 336/84 C |
| 2014/0266505 A1* | 9/2014 | Meyer .................... H01F 19/04 333/175 |

FOREIGN PATENT DOCUMENTS

| | | |
|---|---|---|
| JP | 2002198232 | 7/2002 |
| KR | 20010009821 | 2/2001 |
| WO | WO9962105 | 12/1999 |

OTHER PUBLICATIONS

Ferroxcube, Data Sheet, IIC2-14/4, Integrated inductive components, Sep. 1, 2008, 7 pages.
Ferroxcube, Data Sheet, E22/6/16/R, Planar E cores and accessories, Sep. 1, 2008, 6 pages.
Ferroxcube, Data Sheet, E23/3.6/13, Planar E cores and accessories, Sep. 1, 2008, 4 pages.

* cited by examiner

SOLDERABLE PLANAR MAGNETIC COMPONENTS

RELATED APPLICATIONS

The present application is related to commonly assigned, U.S. provisional patent application Ser. No. 61/781,900, filed Mar. 14, 2013, entitled SOLDERABLE PLANAR MAGNETIC COMPONENTS, which is incorporated herein by reference, and claims priority thereto under 35 U.S.C. §119.

BACKGROUND OF THE INVENTION

The invention is in the field of planar magnetic components for printed circuit boards ("PCB") integrated magnetics, and specifically to inductive components that are solderable to the PCB and a method of soldering the components.

SUMMARY OF THE PRESENT INVENTION

In one aspect, the present disclosure includes an inductive component having a printed circuit board with a first side and a second side. An aperture is defined by the printed circuit board, extending from the first side to the second side. A conductive winding is printed onto the printed circuit board and surrounds the aperture. A core is formed by a first core member and a second core member. The first core member includes a first base member with at least one joining surface which is solderable to the first side of the printed circuit board and a first core leg which extends at least partially through the aperture to function as at least a partial magnetic core for the conductive winding. The second core member includes at least a second base member and is coupled to at least one of the first core member or the second side of the printed circuit board.

In another aspect, the present disclosure includes a method of manufacturing an inductive component, including providing a printed circuit board having a first side and a second side. A aperture extends through the printed circuit board from the first side to the second side. A conductive winding surrounds the aperture. At least one joining surface of a first core member is soldered to the first side using a solder material, and the printed circuit board is inverted. A second core member is coupled to a portion of the first core member or to the second side of the printed circuit board. The first core member and the second core member, combined, include a magnetic core which extends through the aperture.

In another aspect, the present disclosure includes a core member for an inductive component, including a base member with at least one joining surface which is solderable to a printed circuit board. A core leg extends generally perpendicularly from the base member and terminates in a distal core end. The core leg is adapted to extend at least partially through an aperture in a printed circuit board to function as a magnetic core for windings wrapped around the aperture. At least one outer leg extends generally perpendicularly from the base member and terminates in a distal end.

These and other features, advantages, and objects of the present invention will be further understood and appreciated by those skilled in the art by reference to the following specification, claims, and appended drawings.

DETAILED DESCRIPTION

Figure 1:
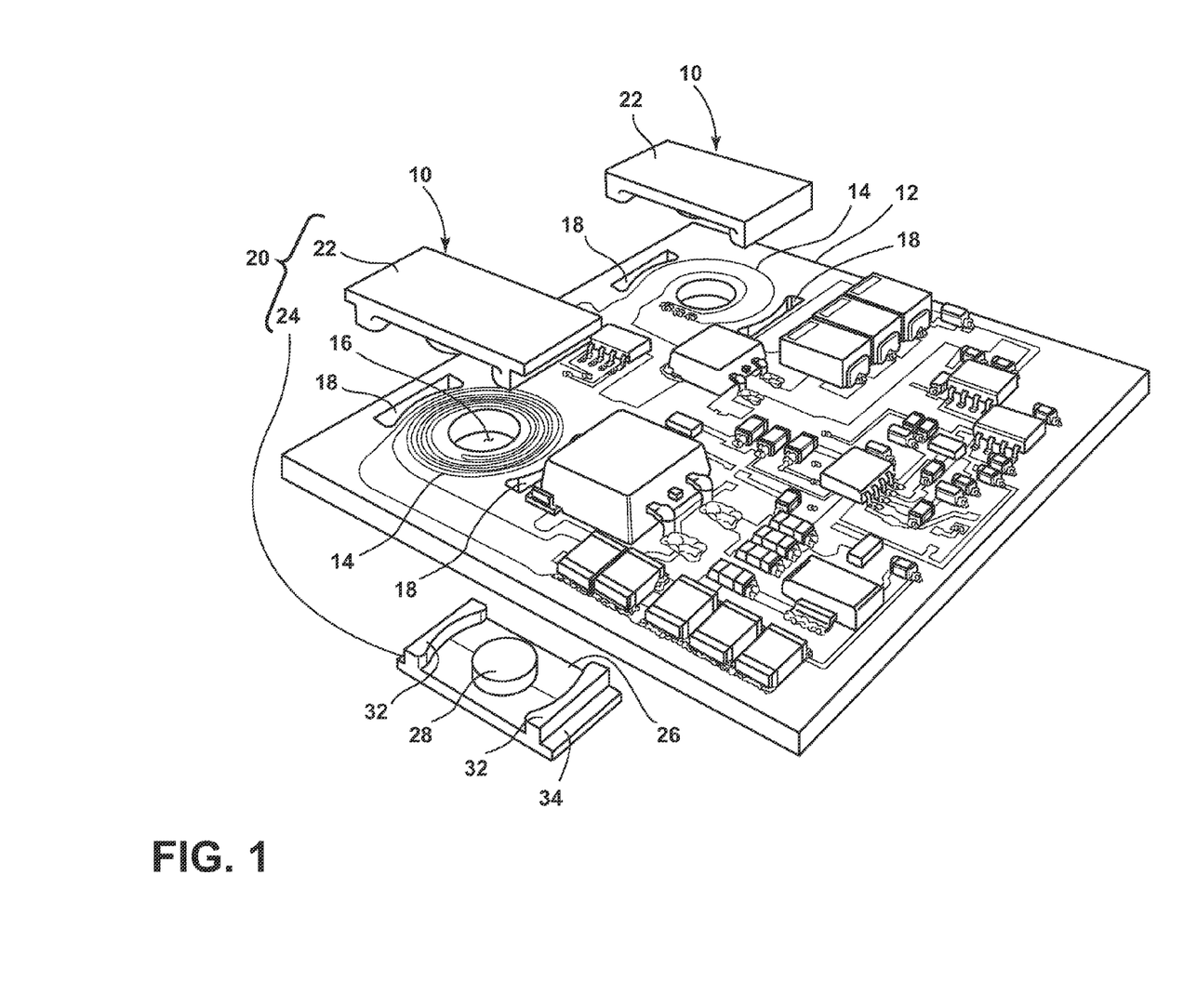
FIG. 1 is a top perspective partially exploded view of a PCB with an inductive component according to the present invention.

For purposes of description herein, the terms "upper," "lower," "right," "left," "rear," "front," "vertical," "horizontal," and derivatives thereof shall relate to the invention as oriented in FIG. 1. However, it is to be understood that the invention may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

Figure 2:
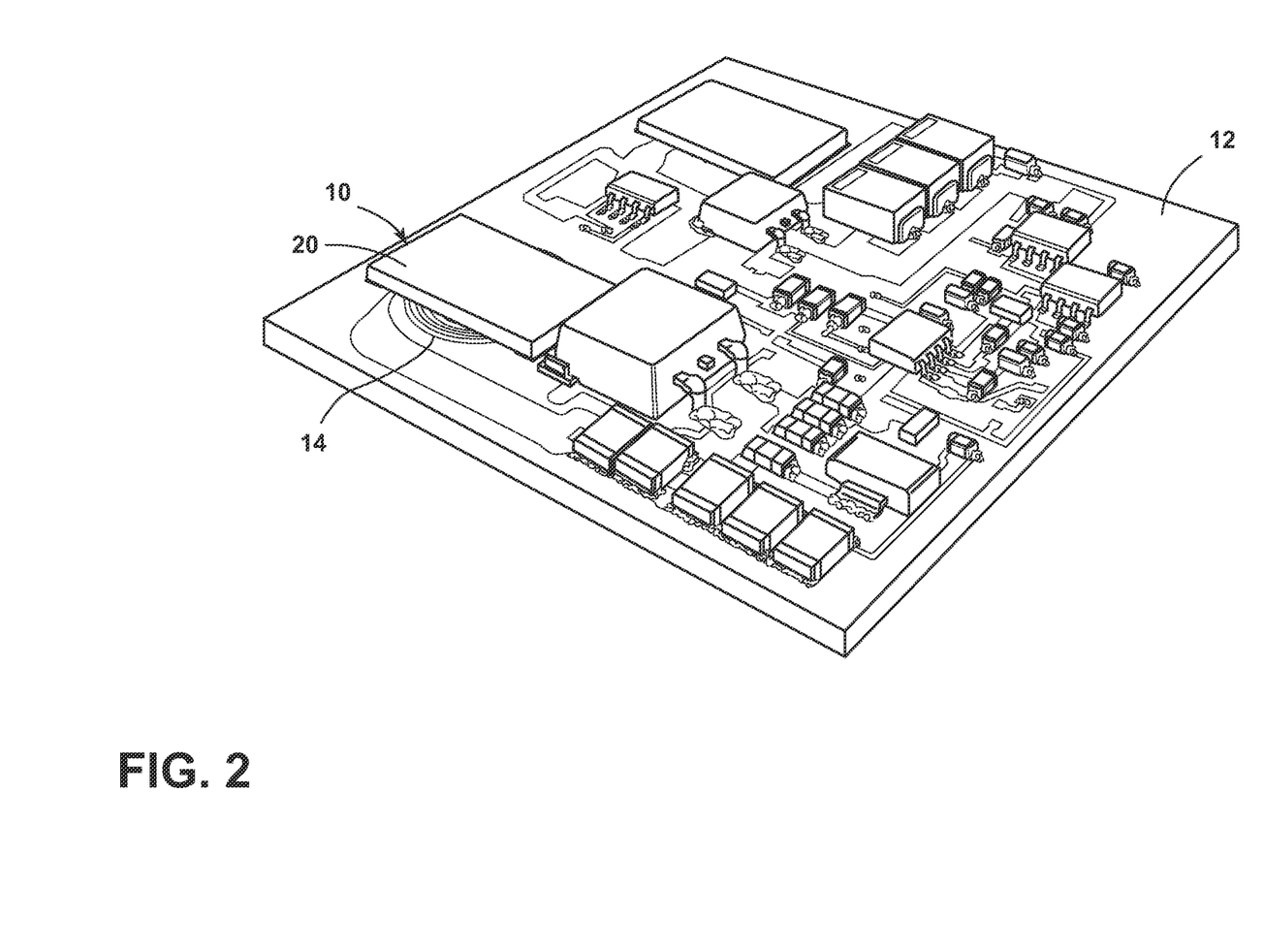
FIG. 2 is a top perspective view of the PCB of FIG. 1 in an assembled state.

Referring now to FIGS. 1 and 2, a planar magnetic inductive component 10 is shown. The planar magnetic inductive component 10 may be an inductor, transformer, common-mode choke, flyback or other known type of planar magnetic component, referred to collectively herein as inductive components 10. The inductive component 10 includes a PCB 12 with conductive windings 14 integrated therein. The conductive windings 14 are preferably printed on the PCB 12 and spiraled through multiple layers thereof. The PCB 12 defines an aperture 16 through the center of the windings 14, and two slots 18 on opposing sides of the windings 14.

Figure 3:
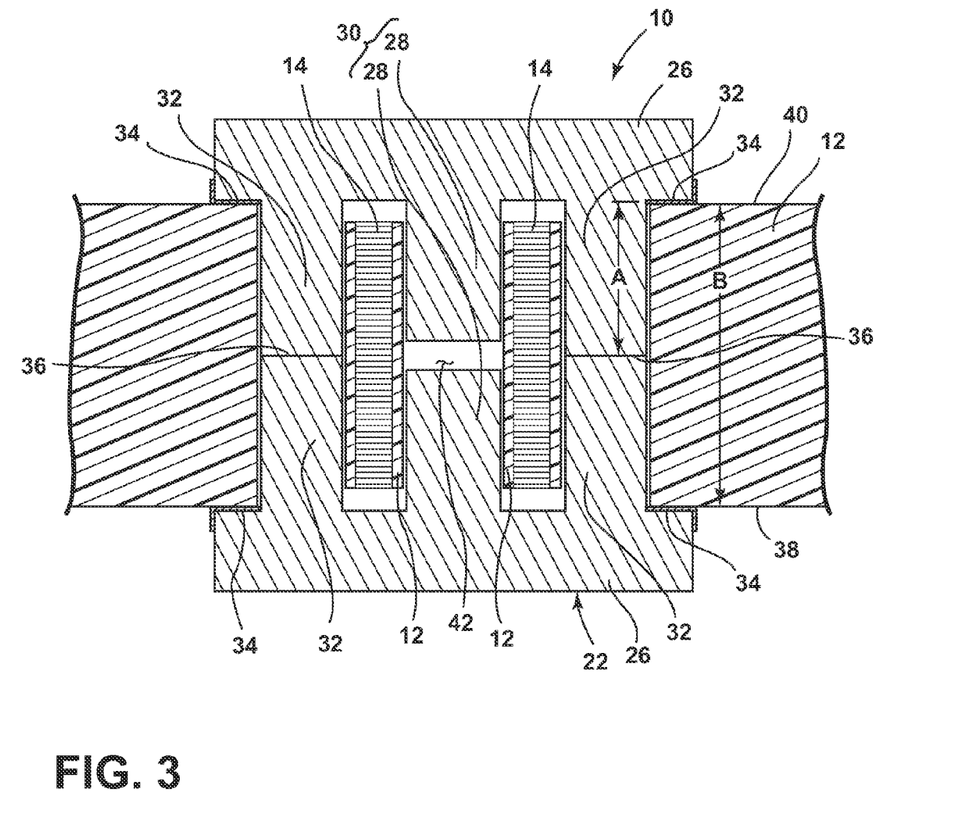
FIG. 3 is a side cross sectional view of the inductive component shown in FIG. 1.
Figure 4:
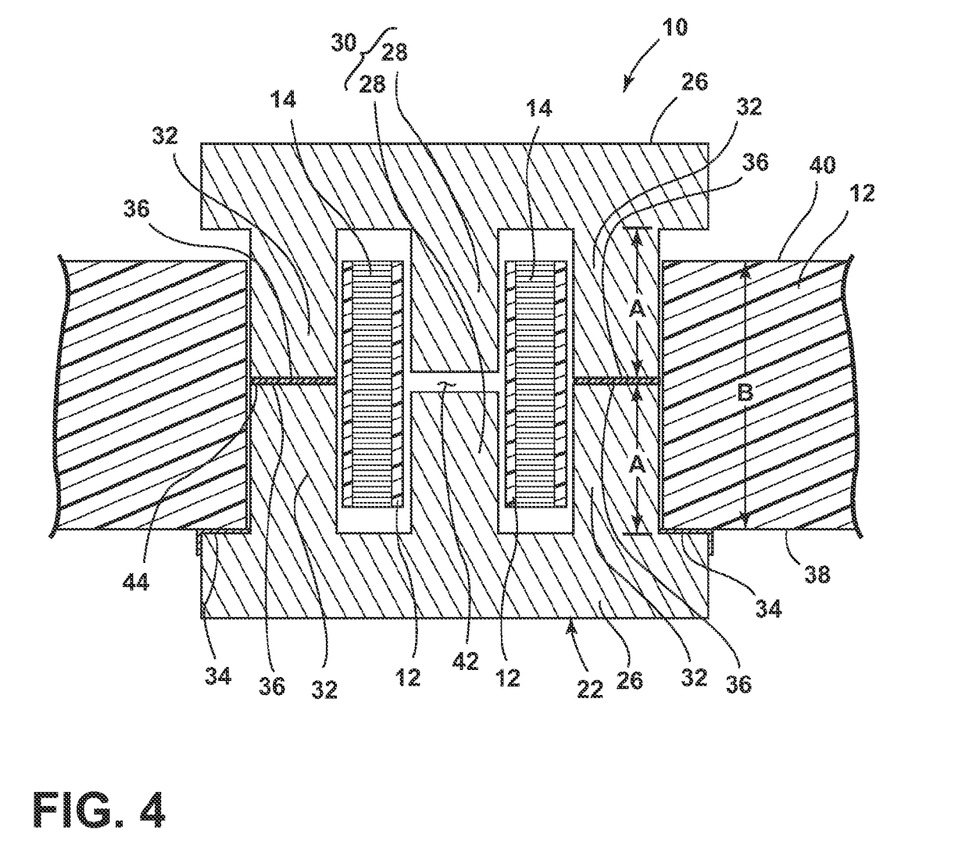
FIG. 4 is a side cross sectional view of another embodiment of the inductive component according to the present invention.
Figure 5:
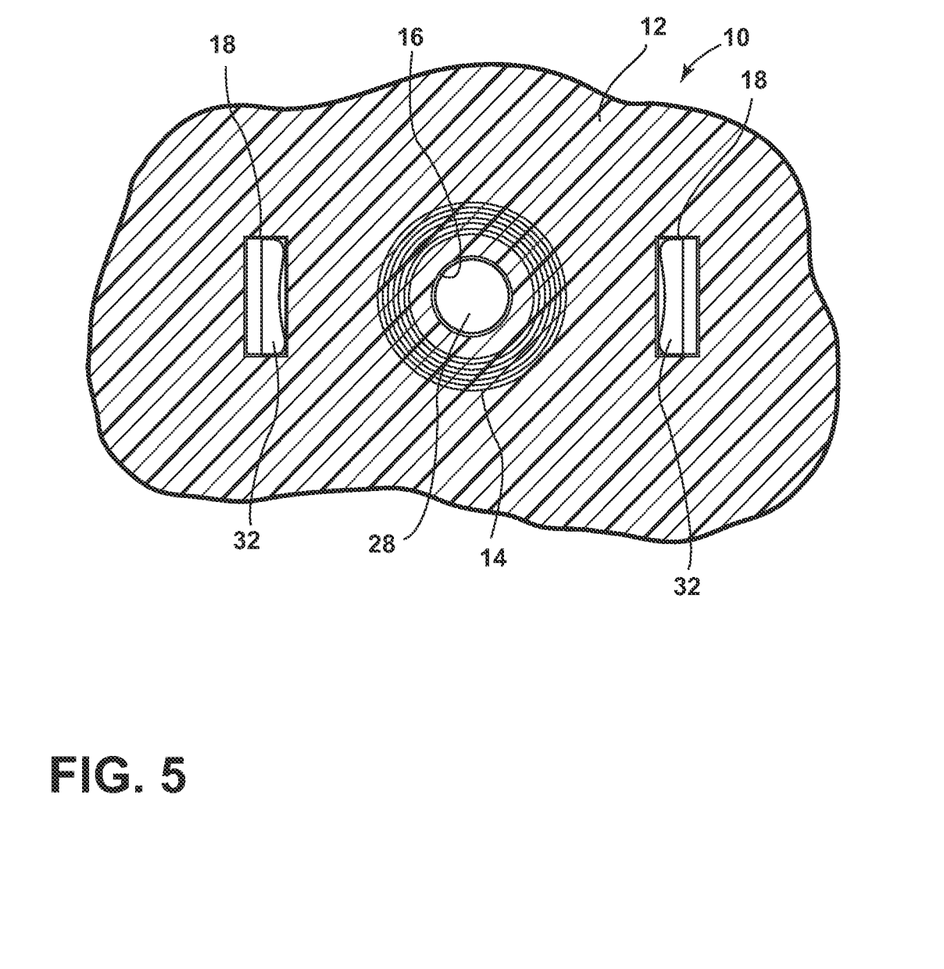
FIG. 5 is a top cross sectional view of the inductive component shown in FIG. 1.

The inductive component 10 further includes a core 20. The core 20 as shown in FIGS. 1-5 is an E-core, which includes a first E-shaped core member 22 and an opposing second E-shaped core member 24 (E-shaped in cross section). As best shown in FIGS. 3-4, each core member 22, 24 includes a base member 26, having a rounded center leg 28, which operates as at least a part of the magnetic core 30 for the inductive component 10 (with the center legs 28 of the first core member 22 and the second core member 24 making up the magnetic core 30), and two generally flat or semi-circular outer legs 32 extending generally perpendicularly from the base member 26. The legs 28, 32 correspond to the aperture 16 and slots 18, respectively, in the PCB 12 as best shown in FIG. 5. The core members 22, 24 may be manufactured from any material known to be useful in manufacturing inductive component cores, such as ferrite ceramics, powdered iron, molypermalloy, sendust or other magnetic materials. It is understood that the shape of the core member 22, 24 and the shape of the legs 28, 32 could be modified, while remaining within the scope of the invention described herein.

As shown in the embodiment depicted in FIG. 3, each core member 22, 24 includes two joining surfaces 34, where the base member 26 extends outwardly past the outer leg 32. Each core member 22, 24 optionally includes at least one joining surface 34, positioned to provide a stable coupling between the core member 22, 24 and the PCB 12. When the core member 22, 24 is aligned with a PCB 12 so that the center leg 28 extends through the aperture 16 and the outer legs 32 extend through the slots 18, the joining surfaces 34 extend outwardly beyond the slots 18, and are adjacent the PCB 12. The joining surfaces 34 are metalized to facilitate a soldered joint between the joining surface 34 and the PCB 12. Metallization may occur through direct metallization of a ferrite core member. Metallization may also be achieved by preparing a slot in the surface to be metalized, laying a metal wire in the slot, and adding solder to the slot. In order to solder the joining surface 34 to the PCB 12, additional solder material is added. Insert molding of solderable materials may also be used to create a solderable joining surface 34. Metalization could also involve mechanically coupling a solderable terminal to the core member 22, 24 where the base member 26 extends outwardly past the outer leg 32 to form the joining surface 34. Coupling the solderable terminal may be performed using known methods, including without limitation, gluing or adhering the solderable terminal, wrapping the solderable terminal around the base member 26, crimping the solderable material to the base; snap-fitting the solderable terminal over the base, or using other known methods for mechanical attachment of the solderable terminal.

Also as shown in the embodiment depicted in FIG. 3, the outer legs 32 have a length A from the base member 26 to a distal end 36 of the outer leg 32 which is about equal to one half of the depth B of the PCB 12, such that when two core members 22 and 24 are installed in the inductive component 10, distal ends 36 of the outer legs 32 come into contact with each other, and the joining surfaces 34 of each E-core member 22, 24 are closely abutting the PCB 12.

To manufacture the inductive component 10, the first core member 22 is aligned with a first side 38 of the PCB 12 such that the center leg 28 extends through the aperture 16 and the outer legs 32 extend through the slots 18. The positioning of the center leg 28 through the center of the windings 14 allows the center leg 28 to function as the magnetic core 30 of the inductive component 10. The magnetic core 30 has a high permeability relative to surrounding air, which causes magnetic field lines to be concentrated and guided in the material of the legs 28 and 32. The optional air gap 42 in the center leg 28 is used to adjust the effective permeability of the magnetic circuit, as when it is desired to create an energy storing component such as an inductor. The air gap 42 may also be eliminated entirely as is desirable for a transformer or common-mode choke, or distributed among the legs 28 and 32. The first core member 22 is soldered to the first side 38 of the PCB 12 at the joining surfaces 34. In the embodiment depicted in FIG. 3, following soldering, the PCB 12 is inverted and the distal ends 36 of the outer legs 32 of the second core member 24 are affixed to the distal ends 36 of the outer legs 32 of the first core member 22, and the second core member 24 is soldered to a second side 40 of the PCB 12. A solder paste or preforms can be used at the interface between the joining surfaces 34 and the PCB 12. A hot-melt/moisture cure adhesive, epoxy, epoxy prepreg, double-sided tape, cyanoacrylate or other adhesives could also be used to couple the joining surfaces 34 to the PCB 12, as well as the use of an ultrasonic bond or weld. Additionally, the coupling method of the joining surfaces 34 to the PCB 12 may be different between the first core member 22 and the second core member 24, or for various joining surfaces 34 on a single core member 22, 24.

To affix the second core member 24 to the first core member 22, the distal ends 36 of the outer legs 32 of the second core member 24 are affixed to the distal ends 36 of the outer legs 32 of the first core 22 via soldering, application of adhesive, ultrasonic bonding, welding, or other coupling method. Alternatively, or in addition to joining the outer legs 32, the joining surfaces 34 of the second core member 24 are soldered to the PCB 12. When each core member 22, 24 is affixed to the PCB 12 in this manner, there is an air gap 42 between the center leg 28 of the first core member 22 and the center leg 28 of the second core member 24.

In certain embodiments, the PCB 12 is populated prior to attaching the first core member 22, and occurs on the same side 38 as the installation of the first core member 22. In other embodiments, the PCB 12 is populated following attachment of the first core member 22, and may occur on the same side 38 or the opposite side 40 as the installation of the first core member 22. For example, the first core member 22 may be adhered to the surface of a first side 38 of the PCB 12, and then the PCB 12 is inverted and populated.

Soldering the joining surfaces 34 to the PCB 12 facilitates high speed production of PCBs 12 having inductive components 10. The joining surfaces 34 are preferably sized to permit the surface tension of the molten solder material to hold the first core member 22 to the PCB 12 during reflow when the PCB 12 is inverted. Where the molten solder is sufficient to anchor the core member 22 to the PCB 12 the production cycle time is reduced, because setting or drying time is not required following the soldering of the joining surfaces 34 to the PCB 12. To determine the size of the joining surfaces 34 required for a eutectic tin/lead solder to hold the weight of the core member 22 when the PCB 12 is inverted during reflow, one approximation that can be used is as follows:

$$w/a > 30$$

where w is the weight of the core member 22 (grams) and a is the surface area of the joining surfaces 34 (square inches). Similar formulas may be derived to accommodate various units of measurement.

Alternatively, the perimeter of the joining surfaces 34 can be estimated using the following formula:

$$F = \gamma * P * \cos \theta$$

where F is the solder wetting force, $\gamma$ is the solder's surface tension, P is the distance about the perimeter of the wetted surface, and $\theta$ is the wetting angle. This formula is useful for estimating the perimeter when various different solders are used, as the particular solder surface tension is taken into account as in the case of lead-free solders.

A multiplier greater than 1 for the calculated surface area or perimeter of the joining surfaces 34 may also be used to provide a buffer and to take into account manufacturing realities, and to ensure that there is sufficient surface tension to hold the core member 22 to the PCB 12 under real world conditions such as non-level work surfaces or vibration. It is also understood that, though two joining surfaces 34 are shown in the illustration, that a greater or lesser number of joining surfaces 34 may be present.

As shown in the embodiment depicted in FIG. 4, the outer legs 32 may also have a length A from the base member 26 to a distal end 36 of the outer leg 32 which is greater than one half of the thickness B of the PCB 12. The thickness B of the PCB 12 is determined using the high side thickness, or the nominal thickness plus a tolerance, to accommodate inconsistencies in the thickness of the PCB 12. The thickness B of the PCB 12 is optionally about 0.062 inches with a tolerance of +/− about 10%, or from about 0.056 inches to about 0.068 inches. When the length A of the outer leg 32 is greater than one half the thickness B of the PCB 12, upon installation of the inductive component 10 the distal ends 36 of the outer legs 32 come into contact with each other and the joining surfaces 34 of the first core member 22 are closely abutting the PCB 12. The joining surfaces 34 of the second core member 24 are not in contact with the PCB 12. Manufacture of an inductive component 10 where the outer legs 32 have a length A that is greater than one half of the depth B of the PCB 12 allows the core 20 to accommodate variations in the thickness of the PCB 12 while providing a uniform air gap 42 between the center legs 28 of the first core member 22 and the second core member 24. The size of the air gap 42 is determined by the relative length of the outer legs 32 and the center leg 28.

To manufacture the inductive component 10, the first core member 22 is soldered to the first side 38 of the PCB 12 at the joining surfaces 34. Following soldering, the PCB 12 is inverted, and the distal ends 36 of the outer legs 32 of the second core member 24 are joined to the distal ends 36 of the outer legs 32 of the first core member 22 to create a coupling 44 therebetween by soldering, application of adhesive, ultrasonic bonding, welding, or other coupling method. Upon assembly, the core 20 is attached to the PCB 12 at two joining surfaces 34, and the length of the air gap 42 between the center leg 28 of the first core member 22 and the center leg 28 of the second core member 24 is controlled by the length A of the outer legs 32.

Figure 6:
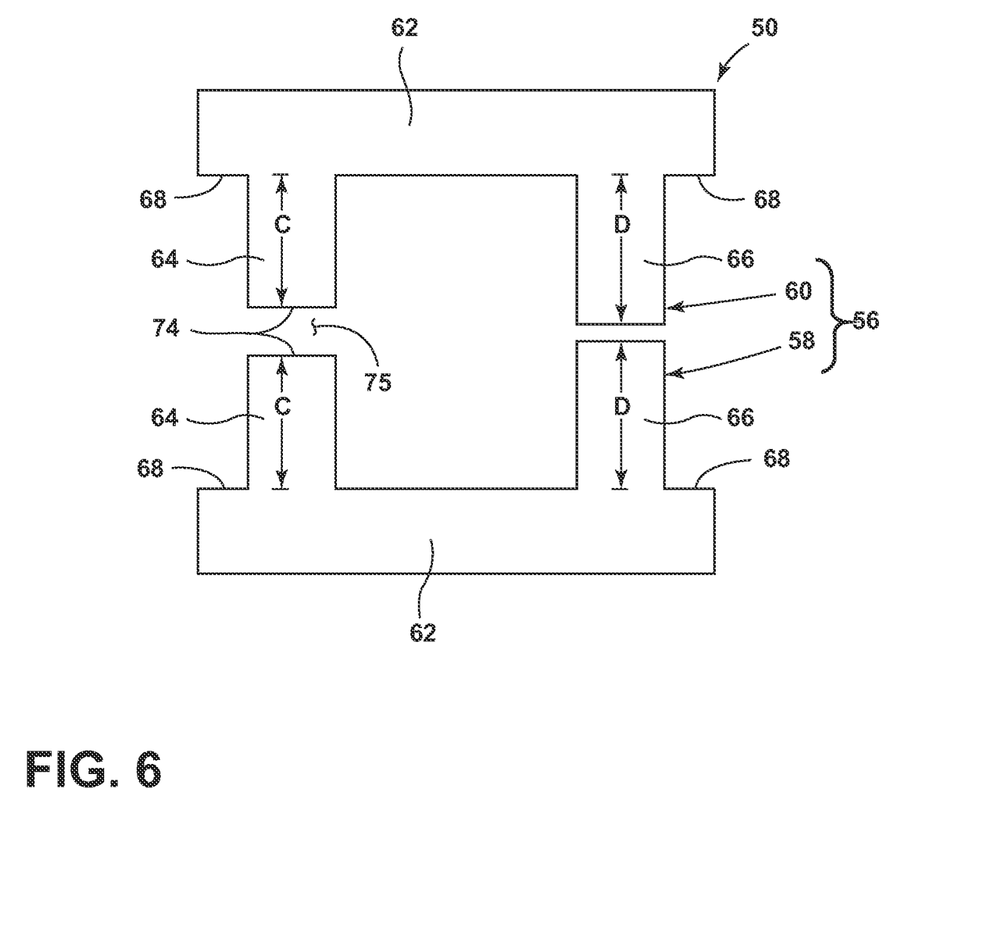
FIG. 6 is a side elevation view of another embodiment of the core for the inductive component according to the present invention.
Figure 7:
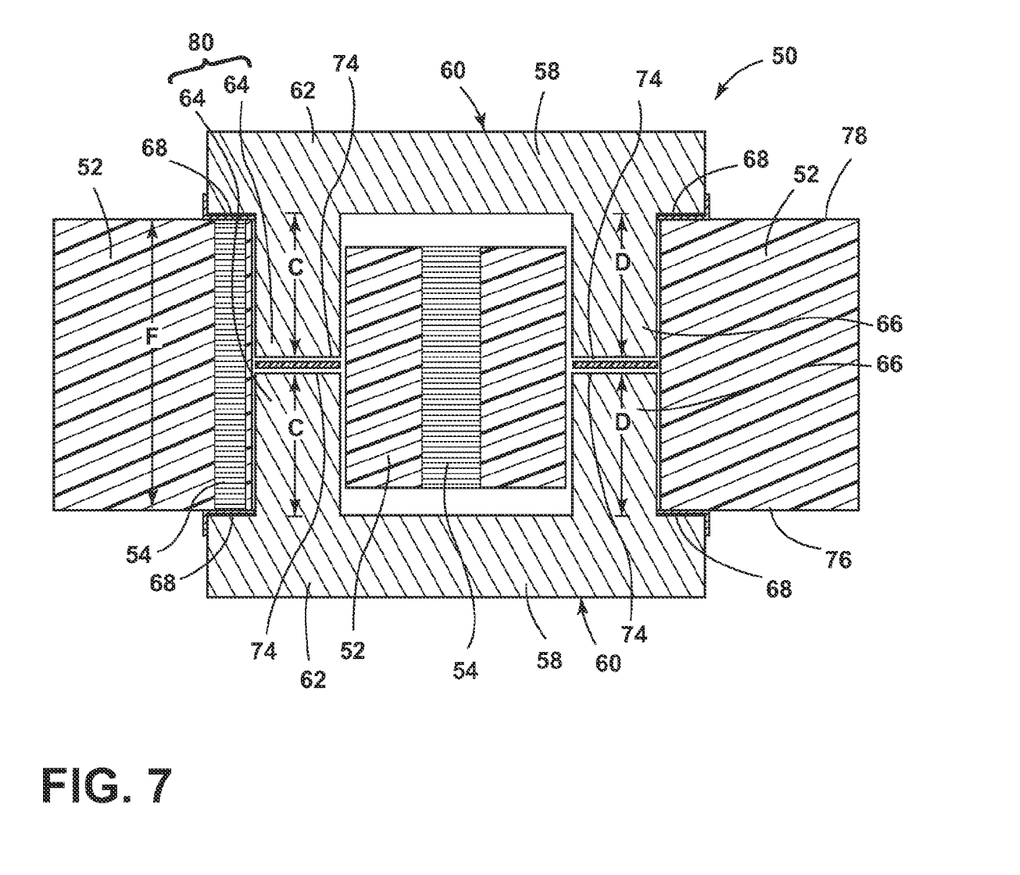
FIG. 7 is a side cross sectional view of the inductive component having the core shown in FIG. 6.
Figure 8:
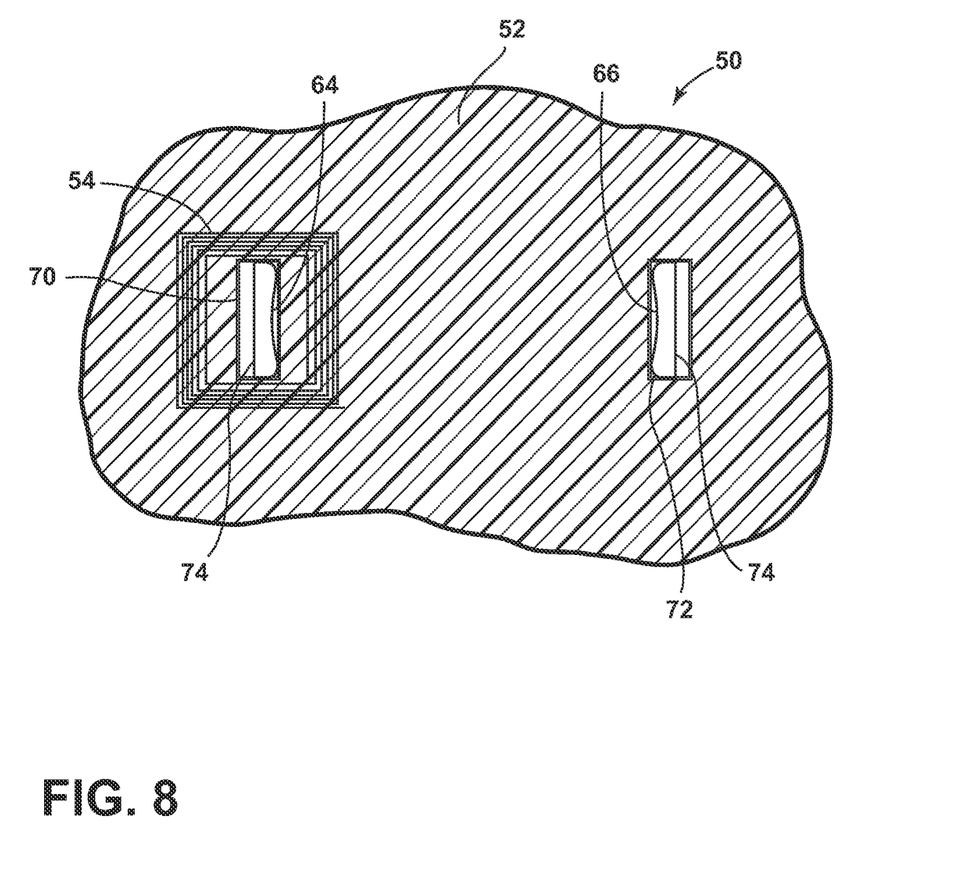
FIG. 8 is a top cross sectional view of the inductive component shown in FIG. 7.

Alternative core types may be used according to the present disclosure. Referring now to FIGS. 6-8, another embodiment of an inductive component 50 includes a PCB 52 with integrated conductive windings 54 and a U-core 56. The U-core 56, as shown in FIGS. 6-8, includes a first U-shaped core member 58 and an opposing second U-shaped core member 60. Each core member 58, 60 includes a base member 62, having a core leg 64 and an outer leg 66 extending generally perpendicularly from the base member 62. The core members 58, 60, as described above, may be manufactured from any material known to be useful in manufacturing inductive component cores, such as ferrite cores.

Also as shown in the embodiment depicted in FIGS. 6-7, each U-shaped core member 58, 60 includes two joining surfaces 68, where the base member 62 extends outwardly past the leg 64, 66. The joining surfaces 68 are metalized to facilitate a soldered joint between the joining surfaces 68 and the PCB 52.

As shown in the embodiment depicted in FIGS. 7-8, the inductive component 50 includes conductive windings 54 integrated into the PCB 52. The PCB 52 defines an aperture 70 through the center of the windings 54 and a slot 72 adjacent the windings 54, outside of the area enclosed by the windings 54. The aperture 70 corresponds to the core legs 64 and the slot 72 corresponds to the outer legs 66 of the U-shaped core members 58, 60. The core leg 64 has a length C from the base member 62 to a distal end 74 of the core leg 64. The outer leg 66 has a length D from the base member 62 to a distal end 74 of the outer leg 66. The length C, D of the legs 64, 66 may be equal, or one of the core leg 64 and outer leg 66 may be longer than the other. Additionally, the length C, D of each leg 64, 66 may be less than, equal to, or greater than one half of the thickness F of the PCB 52. If the combined length (C+C) of the corresponding core legs (64 and 64) in the first core member 58 and second core member 60 is less than the thickness F of the PCB 52, then there will be an air gap 75 between the first legs 64 when installed. If the combined length (C+C or D+D) of the corresponding legs (64 and 64 or 66 and 66) is greater than the thickness F of the PCB 52, then the distal ends 74 of the legs 64, 66 will come into contact with each other, and the joining surfaces 68 of only the first core member 58 are affixed to the PCB 52.

To manufacture the inductive component 50, the first core member 58 is aligned with a first side 76 of the PCB 52, such that the core leg 64 extends through the aperture 70, and therefore through the winding 54 where it can act as a part of the magnetic core 80 for the inductive component 50, and the outer leg 66 extends through the slot 72. The first core member 58 is then soldered to the PCB 52 at the joining surfaces 68. Following soldering, the PCB 52 is inverted. The second core 60 is aligned with the aperture 70 and the slot 72 from a second side 78 of the PCB 52, and the distal ends 74 of the legs 64, 66 of the second core member 60 are affixed to the distal ends 74 of the legs 64, 66 of the first core member 58, and the second core member 60 is optionally soldered to the PCB 52. When both core members 58, 60 are in position, the core legs 64 of the first core member 58 and the second core member 60 together function as the magnetic core 80 for the inductive component 50. In various embodiments, only the adhesion, soldering or welding of the distal ends 74 of the legs 64, 66 is used to affix the second core member 60 in position. In other embodiments, only the soldering of the joining surfaces 68 is used to affix the second core member 60 to the PCB 52.

Figure 9:
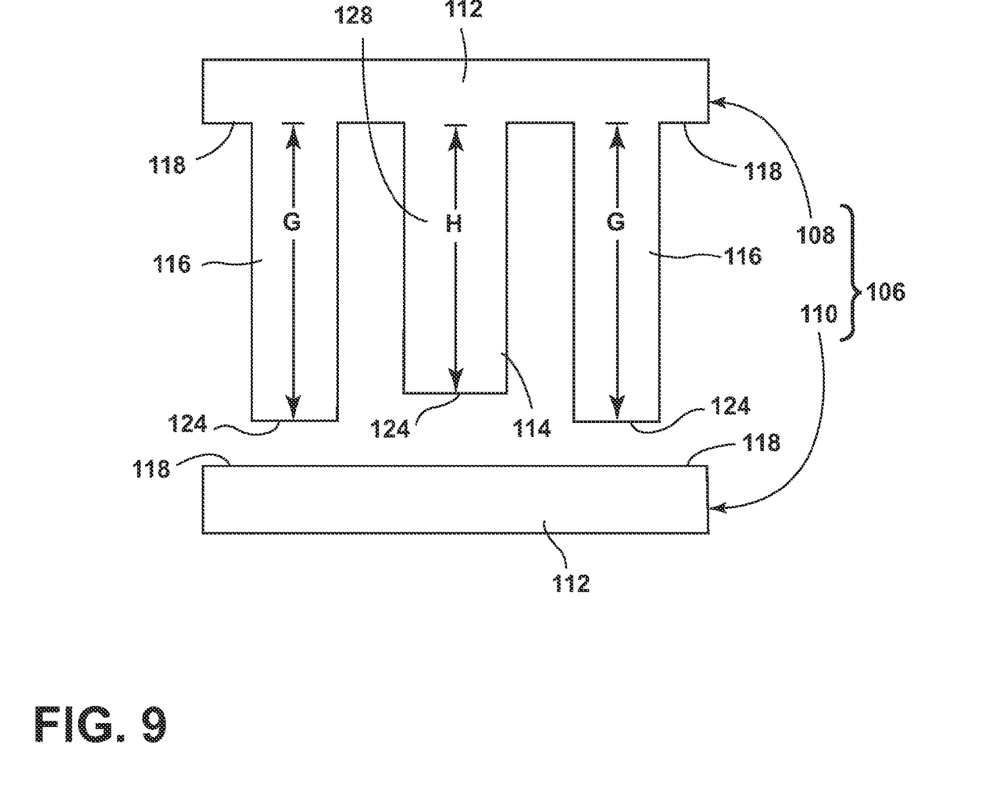
FIG. 9 is a side elevation view of another embodiment of the core for the inductive component according to the present invention.
Figure 10:
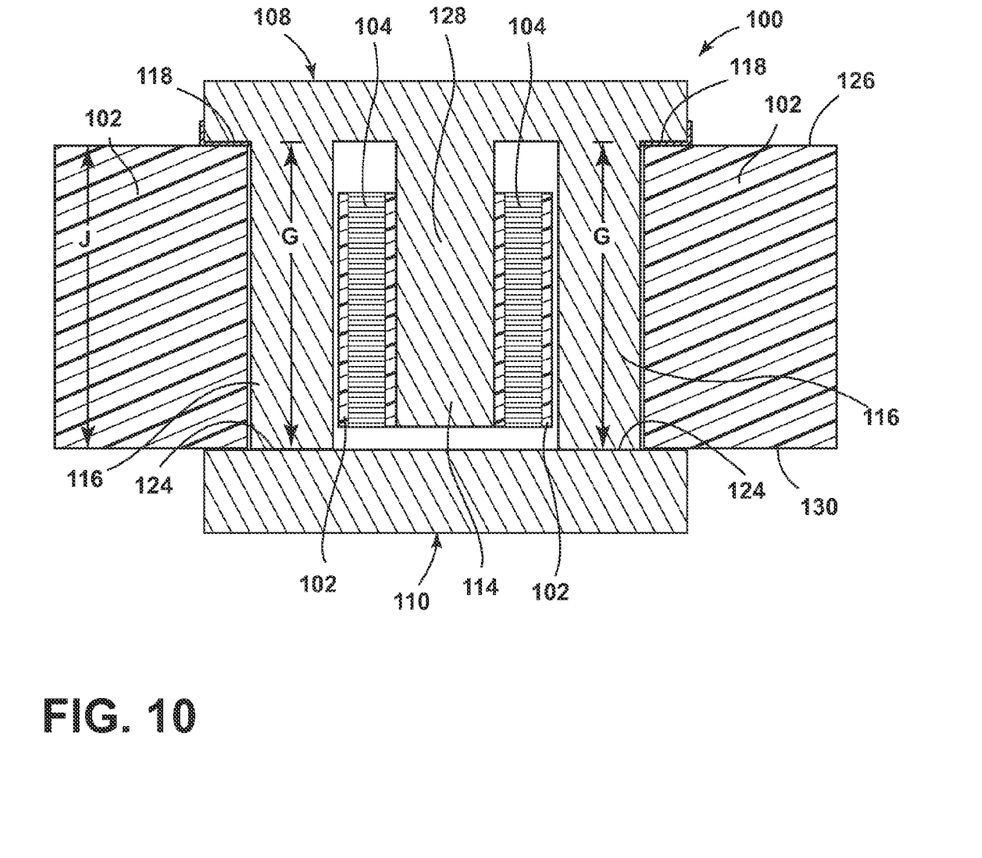
FIG. 10 is a side cross sectional view of the inductive component having the core shown in FIG. 9.
Figure 11:
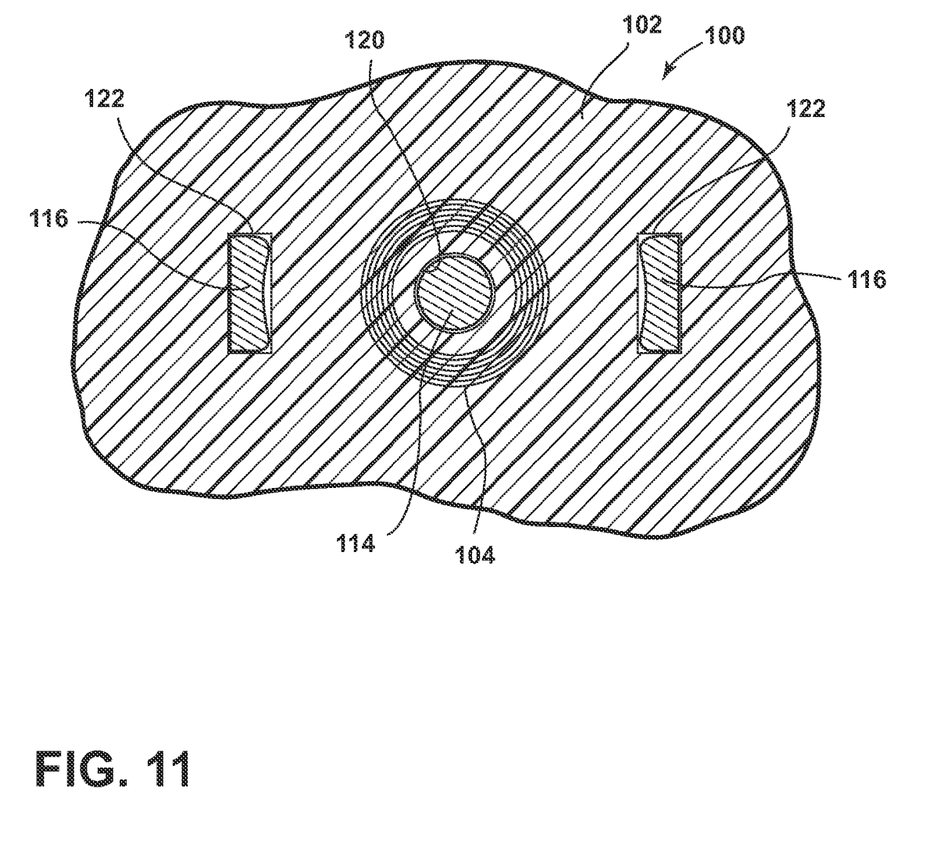
FIG. 11 is a top cross sectional view of the inductive component shown in FIG. 10.

Referring now to FIGS. 9-11, another embodiment of an inductive component 100 on a PCB 102 includes conductive windings 104 integrated into the PCB 102 and an EI-core 106. The EI-core 106, as shown in FIGS. 9-11, includes a first E-shaped core member 108 and an opposing second I-shaped core member 110. Each core member 108, 110 includes a base member 112. The E-core member 108 includes a center leg 114 and two outer legs 116 extending generally perpendicularly from the base member 112. The length of the center leg 114 may be less than that of the outer legs 116. The E-core member 108 also includes two joining surfaces 118, where the base member 112 extends outwardly past the outer legs 116. The I-core member 110 includes a base member 112, which optionally includes joining surfaces 118 at its ends. The joining surfaces 118 are metalized to facilitate a soldered joint between the joining surface 118 and the PCB 102.

As shown in the embodiment depicted in FIGS. 10-11, the inductive component 100 includes conductive windings 104 integrated into the PCB 102. The PCB 102 defines an aperture 120 through the center of the windings 104, and two slots 122 on opposing sides of the windings 104. The aperture 120 and slots 122 correspond to the legs 114, 116 of the E-shaped core member 108. The length G from the base member 112 to a distal end 124 of the center leg 114 and the length H from the base member 112 to a distal end 124 of the outer legs 116 may be equal, or the length H of the center leg 114 may be less than the length G of the outer legs 116. The length G of the outer legs 116 is preferably equal to or greater than the thickness J of the PCB 102.

To manufacture the inductive component 100, the E-core member 108 is aligned with a first side 126 of the PCB 102 with the center leg 114 extending through the aperture 120, such that the center leg 114 is operable as a magnetic core 128 for the inductive component 100, and the outer legs 116 extend through the slots 122. The E-core member 108 is soldered to the PCB 102 at the joining surfaces 118. Following soldering, the PCB 102 is inverted, and the distal ends 124 of some or all of the legs 114, 116 are affixed to the I-core member 110. The joining surfaces 118 of the I-member 110 are optionally also affixed to a second side 130 of the PCB 102. In various embodiments, only the adhesion, soldering or welding of the distal ends 124 of the legs 114, 116 is used to affix the I-core member 110 in position or only the soldering of the joining surfaces 124 is used to affix the I-core member 110 in position. The order of installation of the E and I members 108, 110 could also be inverted.

Figure 12:
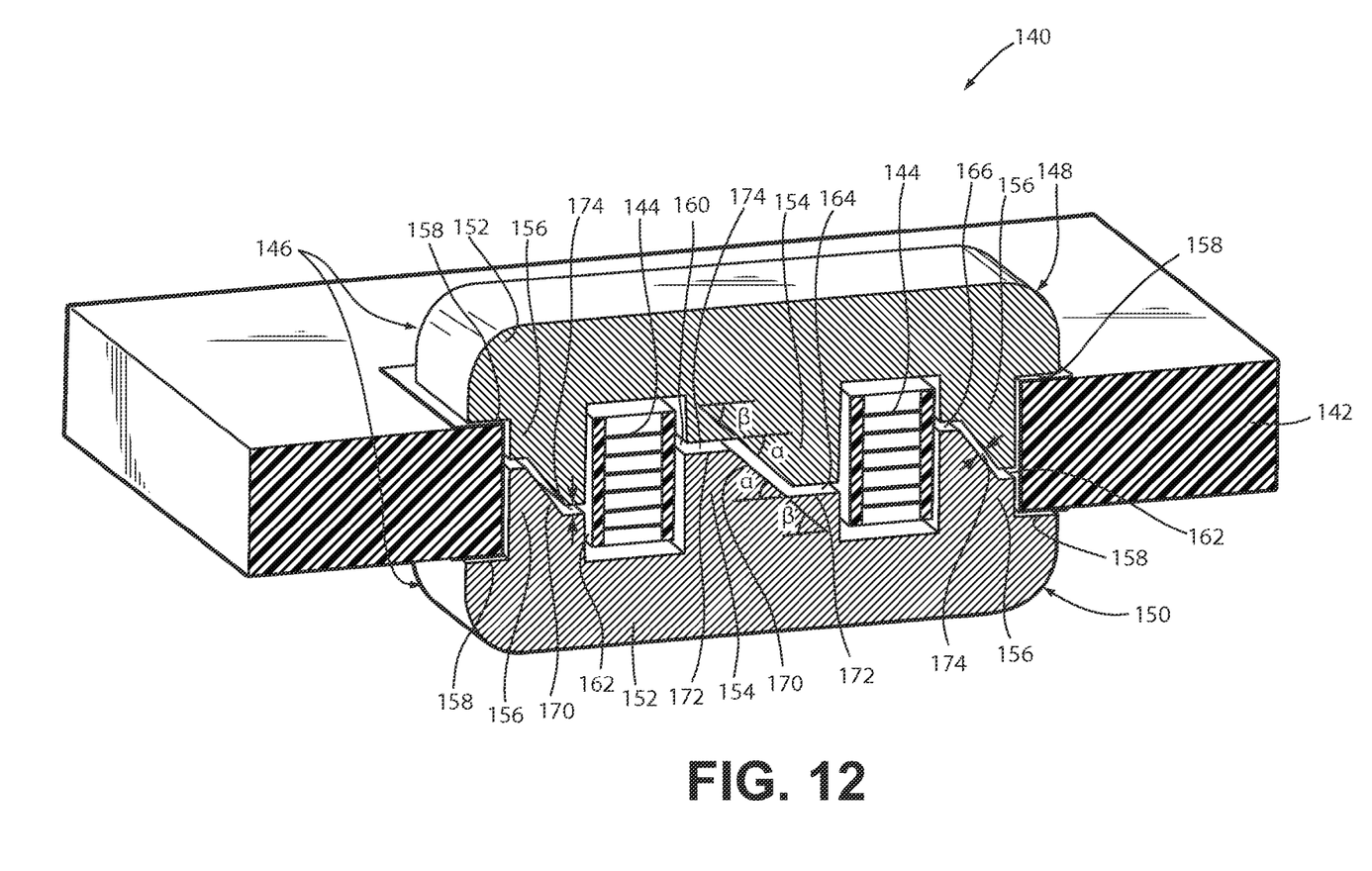
FIG. 12 is a side cross sectional view of another embodiment of the inductive component.

Referring now to FIG. 12, another embodiment of an inductive component 140 on a PCB 142 includes conductive windings 144 integrated into the PCB 142, and a shaped gap core 146. The shaped gap core 146 includes a first E-shaped core member 148 and a second E-shaped core member 150. Each core member 148, 150 includes a base member 152, and a center leg 154 and two outer legs 156 extending generally perpendicularly from the base member 152. Each E-core member 148, 150 includes two joining surfaces 158 where the base member 152 extends outwardly past the outer legs 156. The joining surfaces 158 are metalized to facilitate a soldered joint between the joining surfaces 158 and the PCB 142 as described in greater detail herein. As shown in the embodiment depicted in FIG. 12, the PCB 142 defines an aperture 160 through the center of the windings 144, and two slots 162 on opposing sides of the windings 144, where the aperture 160 corresponds to the center legs 154 and the slots 162 correspond to the outer legs 156.

In the embodiment depicted in FIG. 12, each of the center legs 154 has a core distal end 164 and each of the outer legs 156 has a distal end 166. The core distal ends 164 and the distal end 166 are shaped, with at least an angled portion 170. In the embodiment shown in FIG. 12, a flat portion 172 is also provided on one or both sides of the angled portion 170. The angled portion 170 is at an angle α of 0° to 90° from the flat portion 172, preferably between about 45° and 90°, and more preferably between about 70° and about 90°. The angled portion 170 is also at an angle β of 0° to 90° from the base member 152, preferably between about 45° and 90° from the base member 152, and more preferably between about 70° and about 90° from the base member 152, wherein the angle β from the base member 152 can be used whether or not a flat portion 172 is present in a particular embodiment. When assembled, the angled portions 170 of one core member 148 align with the angled portions 170 of the other core member 150, and an air gap 174 is optionally provided between the center legs 154 of the first core member 148 and the second core member 150. By moving the core members 148, 150 side-to-side, the width of the air gap 174 between the angled portions 170 can be adjusted, while the distance between flat portions 172 will remain constant. Additionally, when the thickness of the PCB 142 increases, the air gap 174 between the angled portions 170 is not impacted as much as the distance between flat portions 172 would be, though the surface area of the core distal ends 164 having the given air gap 174 therebetween may be reduced. Additionally the air gap 174 between corresponding flat portions 172 and the air gap 174 between corresponding angled portions 170 are not necessarily the same. Therefore, using shaped core distal ends 164 and distal ends 166 as described herein reduces variation in the effective width of the air gap 174 resulting from variation in PCB 142 thickness.

Additionally, the total surface area of the core distal ends 164 and distal ends 166 of the legs 154, 156 are increased by including the angled portion 170, thereby reducing the gap reluctance. In one embodiment, the angled portions 170 of corresponding legs 154, 156 are positioned to have a relatively smaller air gap 174, with a relatively larger air gap 174 between the flat portions 172. The reluctance variation with respect to PCB 142 thickness will be reduced as the lowest reluctance portion of the air gap 174 (the angled portion 170) will have a substantially constant air gap 174 as the PCB 142 thickness varies. The air gap 174 may be filled with any low permeability or non-magnetic material without substantially affecting the magnetic properties.

It will be understood that any described processes or steps within described processes may be combined with other disclosed processes or steps to form structures within the scope of the present invention. The exemplary structures and processes disclosed herein are for illustrative purposes and are not to be construed as limiting.

It is also to be understood that variations and modifications can be made on the aforementioned structures and methods without departing from the concepts of the present invention, and further it is to be understood that such concepts are intended to be covered by the following claims unless these claims by their language expressly state otherwise.

What is claimed is:
1. An inductive component, comprising:
   a printed circuit board having a first side and a second side;
   an aperture defined by the printed circuit board, extending from the first side to the second side;
   a conductive winding surrounding the aperture;
   a core, formed by a first core member and a second core member, wherein the first core member comprises:
   a first base member with a first joining surface, the first joining surface forming a first soldered connection to the first side of the printed circuit board, and
   a first core leg which extends at least partially through the aperture to function as at least a partial magnetic core for the conductive winding, and
   wherein the second core member comprises:
   a second base member with a second joining surface, the second joining surface forming a second soldered connection to the second side of the printed circuit board;
   wherein the first joining surface is formed by the first base member extending outward from the first core leg; and
   wherein an air gap is formed between a first portion of the first core member and the second core member.
2. The inductive component of claim 1, wherein the first core member includes at least one outer leg having a first distal end, and the printed circuit board includes at least one slot, and wherein the at least one outer leg extends at least partially through the at least one slot.

3. The inductive component of claim 2, wherein the first core member includes at least two outer legs having distal ends, and the printed circuit board includes at least two slots, and wherein each of the at least two outer legs extends at least partially through the one of the at least two slots.

4. The inductive component of claim 1, wherein the second core member includes a second core leg which extends at least partially through the aperture to function as at least a partial magnetic core for the conductive winding.

5. The inductive component of claim 4, further comprising:
- a first core leg distal end;
- a second core leg distal end; and
- the air gap between the first core leg distal end and the second core leg distal end.

6. The inductive component of claim 4, further comprising:
- a first outer leg extending from the first base member and terminating in a first distal end;
- a second outer leg extending from the second base member and terminating in a second distal end; and
- a slot extending from the first side to the second side of the printed circuit board, wherein the first outer leg and the second outer leg each extend at least partially through the slot.

7. The inductive component of claim 6, wherein the first outer leg and the second outer leg have a combined length which is sufficient to cause an air gap between the first core member and the second core member in the aperture.

8. The inductive component of claim 1, wherein the at least one joining surface is metalized through at least one of direct metallization of the first core member, laying metal wire in a slot on the at least one joining surface, insert molding of solderable materials on the at least one joining surface, and mechanically coupling a solderable terminal to the first core member.

9. The inductive component of claim 1, wherein the at least one joining surface has a total surface area sized to permit a molten solder material applied to the at least one joining surface to secure the first core member to the first side of the printed circuit board when the printed circuit board is positioned with the first side facing downward.

10. The inductive component according to claim 1, wherein the air gap is maintained independent of a thickness of the printed circuit board.

11. The inductive component of claim 5, wherein the first core leg distal end and the second core leg distal end are each shaped with corresponding flat portions and angled portions, and wherein each angled portion is at an angle of greater than 0° and less than 90° from the flat portion.

12. The inductive component of claim 11, wherein the angle of the angled portion to the flat portion is at an angle of greater than 45°.

13. A core member for an inductive component, comprising:
- a pair of base members with at least one joining surface forming a soldered connection to a printed circuit board;
- a plurality of core legs extending generally perpendicularly from each of the base members and terminating in a plurality of distal core ends, wherein the core legs are adapted to extend at least partially through at least one aperture in the printed circuit board to function as a magnetic core for windings wrapped around the aperture;
- at least one outer leg extending generally perpendicularly from a first base member of the pair of base members and adapted to extend through the at least one aperture in the printed circuit board, the outer leg terminating in a distal end configured to couple to at least one of the core legs of a second base member of the pair of base members in an assembled configuration;
- an inner leg disposed proximate the outer leg, the inner leg forming at least a portion of an air gap in the assembled configuration;
- a first joining surface formed by the first base member extending outward from the at least one outer leg, wherein the first joining surface is configured to form a soldered connection with a first side of the printed circuit board proximate the at least one aperture; and
- a second joining surface formed by the second base member, wherein the second joining surface forms a soldered connection with a second side of the printed circuit board proximate the at least one aperture.

14. The core member of claim 13, wherein at least one of the distal core end and the distal end are shaped with an angled portion, and wherein the angled portion is at an angle of greater than 0° and less than 90° with respect to the base member.

15. The core member of claim 14, wherein the angled portion is at an angle of greater than 45° with respect to the base member.

16. An inductive component, comprising:
- a printed circuit board having a first side and a second side;
- an aperture defined by the printed circuit board, extending from the first side to the second side;
- a conductive winding surrounding the aperture;
- a core, formed by a first core member and a second core member, wherein the first core member comprises:
  - a first base member forming a first joining surface, the first joining surface forming a first soldered connection to the first side of the printed circuit board, and
  - a first core leg extending at least partially through the aperture to function as at least a partial magnetic core for the conductive winding;
- wherein the second core member comprises at least a second base member forming a second joining surface, the second joining surface forming a second soldered connection to the second side of the printed circuit board; and
- wherein the first joining surface is formed by the first base member extending outward from the first core leg.

17. The inductive component of claim 16, wherein the second core member further comprises:
- a second core leg extending at least partially through the aperture to function as at least a partial magnetic core for the conductive winding.

18. The inductive component of claim 17, wherein the second joining surface is formed by the base member extending outward from the second core leg.

* * * * *